United States Patent [19]

Duttweiler

[11] B  3,990,073
[45]  Nov. 2, 1976

[54] DIGITAL SIGNAL PROCESSING ARRANGEMENT USING A CASCADED INTEGRATOR FUNCTION GENERATOR

[75] Inventor: Donald Lars Duttweiler, Colts Neck, N.J.

[73] Assignee: Bell Telephone Laboratories, Incorporated, Murray Hill, N.J.

[22] Filed: Nov. 22, 1974

[21] Appl. No.: 526,106

[44] Published under the second Trial Voluntary Protest Program on January 27, 1976 as document No. B 526,106.

[52] U.S. Cl.................... 340/347 AD; 340/347 DA; 235/183; 235/197
[51] Int. Cl.$^2$...................................... H03K 13/20
[58] Field of Search............. 340/347 AD, 347 DA, 340/347 NT; 235/183, 197; 328/127, 142, 178

[56]  References Cited
UNITED STATES PATENTS 3,513,467  5/1970  Sliwkowski................... 340/347 AD
3,653,035  3/1972  Carbrey....................... 340/347 AD

OTHER PUBLICATIONS

Johannesen "Electronics Letters" Sept. 23, 1971, vol. 7, No. 10, pp. 593-594.

*Primary Examiner*—Charles D. Miller
*Attorney, Agent, or Firm*—Richard J. Roddy; Donnie E. Snedeker

[57]  ABSTRACT

An analog-to-digital counting encoder or a digital-to-analog counting decoder for a pulse code modulation signal typically requires a function generator using precision components to generate a piecewise linear comparison signal corresponding to a segment companding law. As a result, nonproportional component change introduces nonlinear distortion in the encoded or decoded signal. To mitigate nonlinear distortion and to provide a less expensive digital signal processing arrangement, the invention resides in an improved nonprecision component function generator. The function generator includes two serially connected integrators which are advantageously switched in a complementary fashion to provide the comparison signal.

9 Claims, 3 Drawing Figures

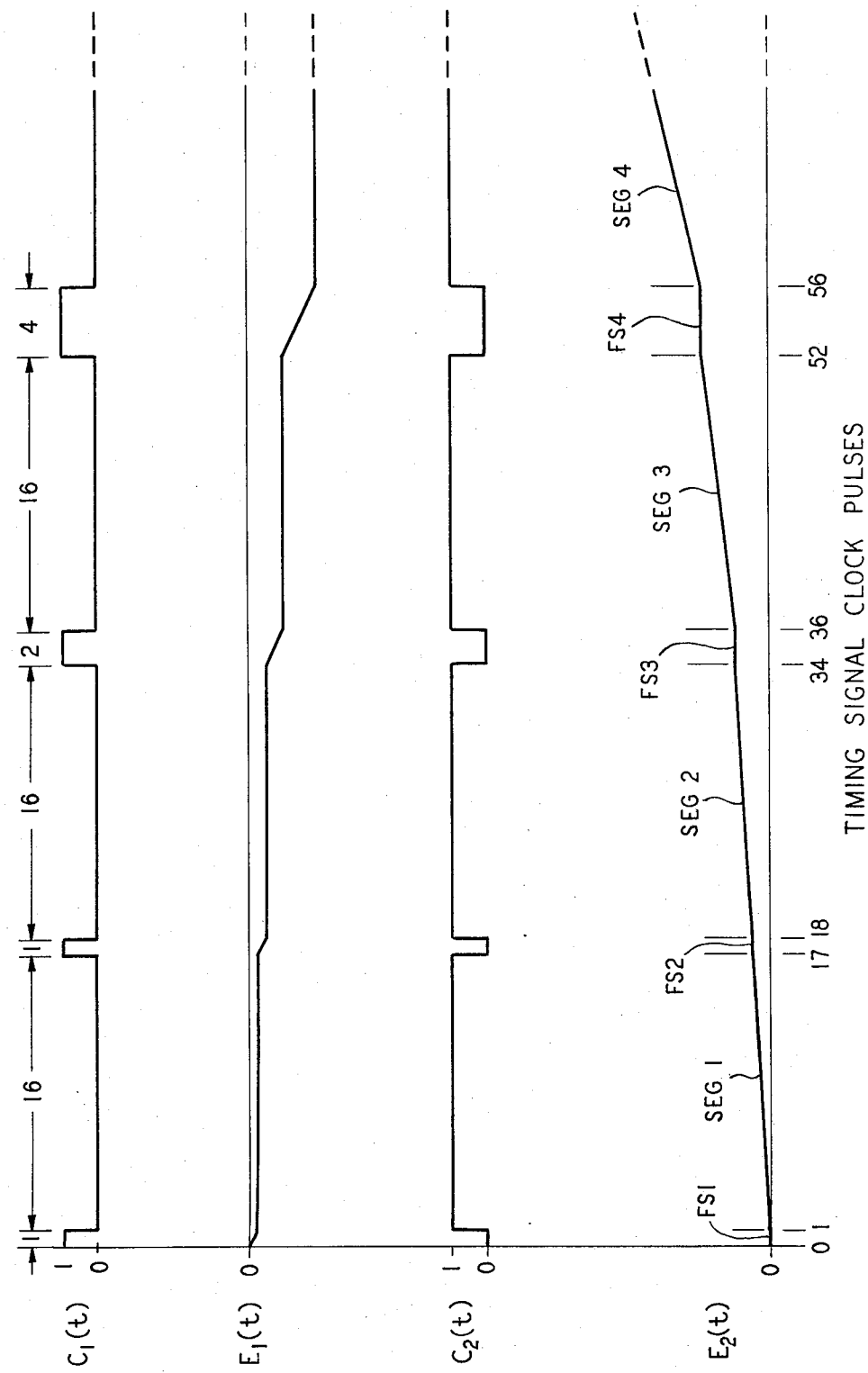

DIGITAL SIGNAL PROCESSING ARRANGEMENT USING A CASCADED INTEGRATOR FUNCTION GENERATOR

FIELD OF THE INVENTION

This invention relates to digital signal processing and, more particularly, to analog-to-digital and digital-to-analog processing of nonlinear pulse code modulation (PCM) signals.

BACKGROUND OF THE INVENTION

In a PCM system, an analog input signal is typically applied to an analog-to-digital (A/D) converter for generating a digital code word representing the analog signal. In the A/D converter, the input signal may be connected, for example, through a low-pass filter and a sample-and-hold circuit, to an encoder for generating the digital code word. In normal usage the code word is transmitted in the form of a serial bit stream to a receiving station. Thereat a digital-to-analog (D/A) converter including a decoder reconstructs the original analog signal.

Counting encoders and decoders typically employ a function generator to develop a comparison signal corresponding to a particular companding law. Of increasing interest in the PCM field is the use of segment companding laws, which are essentially piecewise linear approximations of a nonlinear companding law, also called a nonuniform companding law in the art. Each linear piece is called a segment. While at the present time there has been no worldwide standardization of companding laws, two which have been widely used are the $\mu$ Law and the A Law. For ease of description, the following disclosure is made in terms of the $\mu$ Law, where the value of $\mu$ specifies the degree of curvature of the companding characteristic.

Known encoder and decoder function generators typically employ precision components, e.g., a precision resistor ladder, to develop the comparison signal. As a result, if the precision components change nonproportionately, the ratios of successive linear segments may deviate substantially from an intended design ratio. Thereby distortion is introduced in the encoded or decoded PCM signal.

Accordingly, it is a general object of the invention to lessen nonlinear distortion which may be introduced during encoding and decoding of PCM signals.

It is a further object of the invention to lessen the need for precision components and accordingly provide a less expensive digital signal processing arrangement.

A more particular object of the invention is to alleviate the need for precision components in a digital signal processing arrangement for generating a segment companding law comparison signal.

SUMMARY OF THE INVENTION

These and additional objects are achieved in accordance with the principles of the invention by an improved digital signal processing arrangement including a function generator having two serially connected, nonprecision component integrators. Responsive to a timing signal, the integrators are advantageously operated in a complementary fashion to generate a predetermined segment companding law comparison signal. Thereby the accuracy of the timing signal is substituted for component precision.

BRIEF DESCRIPTION OF THE DRAWING

FIG. 3 shows a timing relationship between selected positive quadrant signals in a function generator and timing signal clock pulses, in accordance with the invention.

DETAILED DESCRIPTION

Figure 1:
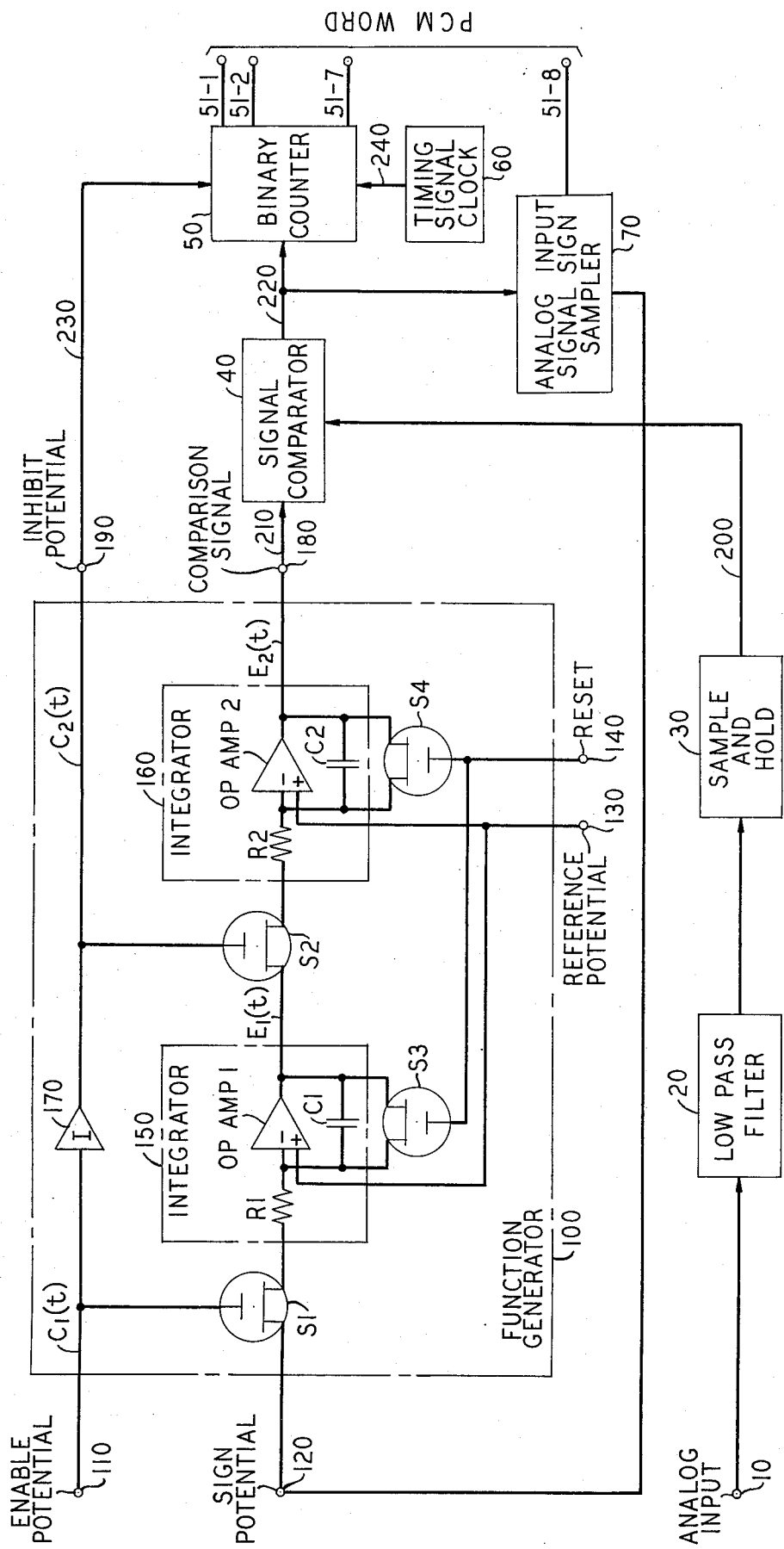
FIG. 1 is a schematic block diagram showing an illustrative embodiment of a digital signal processing arrangement including a function generator in accordance with the invention.

FIG. 1 shows a counting encoder, A/D converter, digital signal processing arrangement. Broadly, when clocked binary counter 50 is enabled, piecewise linear comparison signal $E_2(t)$ is provided by function generator 100 to lead 210. The counter is clocked by conventional timing signal clock 60 at time intervals corresponding to the quantizing levels of the encoder. Counter 50 counts the number of quantizing levels until the comparison signal exceeds the magnitude of a sampled-and-held analog input signal appearing on lead 200. Signal comparator 40 detects the exceeding and provides a signal on lead 220 to disable counter 50. The then state of the counter is the digital code word representation of the analog signal, or the PCM code word.

Illustratively, counter 50 is a conventional seven-bit counter including information bit output terminals 51-1 through 51-7. The seven bits and a sign bit provided at sign output terminal 51-8 of analog input signal sign sampler 70 comprise the eight-bit PCM code word generated by the arrangement in FIG. 1. An output terminal of comparator 40 and inhibit potential terminal 190 of function generator 100 are respectively connected over leads 220 and 230 to first and second inputs of binary counter 50. An output from a conventional timing signal clock 60 is connected over lead 240 to a third input of binary counter 50.

In the illustrative embodiment of nonprecision component function generator 100, the timing accuracy of clock 60 is employed in generating a 15-segment, $\mu = 255$ companding law comparison signal. Function generator 100 includes sign potential terminal 120 connected through switch S1 to an input of conventional integrator 150, including operational amplifier OP AMP1, resistor R1 and capacitor C1. An output of integrator 150 is connected through switch S2 to an input of conventional integrator 160, including operational amplifier OP AMP2, resistor R2 and capacitor C2. An output of integrator 160 is connected to comparison terminal 180. Switches S3 and S4 are respectively connected circuitwise in parallel to capacitors C1 and C2. Switches S1 through S4 are illustratively shown as field effect transistors. Enable potential terminal 110 is jointly connected to a control electrode of switch S1 and through inverter 170 jointly to inhibit potential terminal 190 and to a control electrode of switch S2. Reset terminal 140 is jointly connected to respective control electrodes of switches S3 and S4.

Generally, at the start of an encoding period, an analog signal to be digitally encoded is applied to analog input terminal 10, filtered by low-pass filter 20, sampled and held by sample-and-hold circuit 30. Responsive to a reset signal applied to reset terminal 140, comparison signal $E_2(t)$ is reset to a reference potential. The reference potential is applied to a second input of integrators 150 and 160 through reference potential terminal 130. The held signal and the comparison signal are applied on leads 200 and 210, respectively, to a first and second input of comparator 40. An output of comparator 40 is sampled by analog input signal sign sampler 70 to determine the algebraic sign of the analog input signal relative to the reference potential. Responsive thereto, a positive or a negative sign potential is applied to sign potential terminal 120 and a predetermined signal is provided at sign bit terminal 51-8 of sampler 70, Also counter 50 is reset to a count of zero. Thereafter, a predetermined logic signal, here, for example, a logic one signal, is provided at inhibit terminal 190 of function generation 100 to enable counter 50. Comparison signal $E_2(t)$ is extended through comparison terminal 180, and is then compared by comparator 40 with the held signal on lead 200. When the magnitude of the comparison signal exceeds the magnitude of the held signal, an inhibit signal is placed on lead 220 by comparator 40. Responsive thereto counter 50 is disabled. The then state of counter 50 corresponds to a digital encoding of the analog signal.

Figure 2:
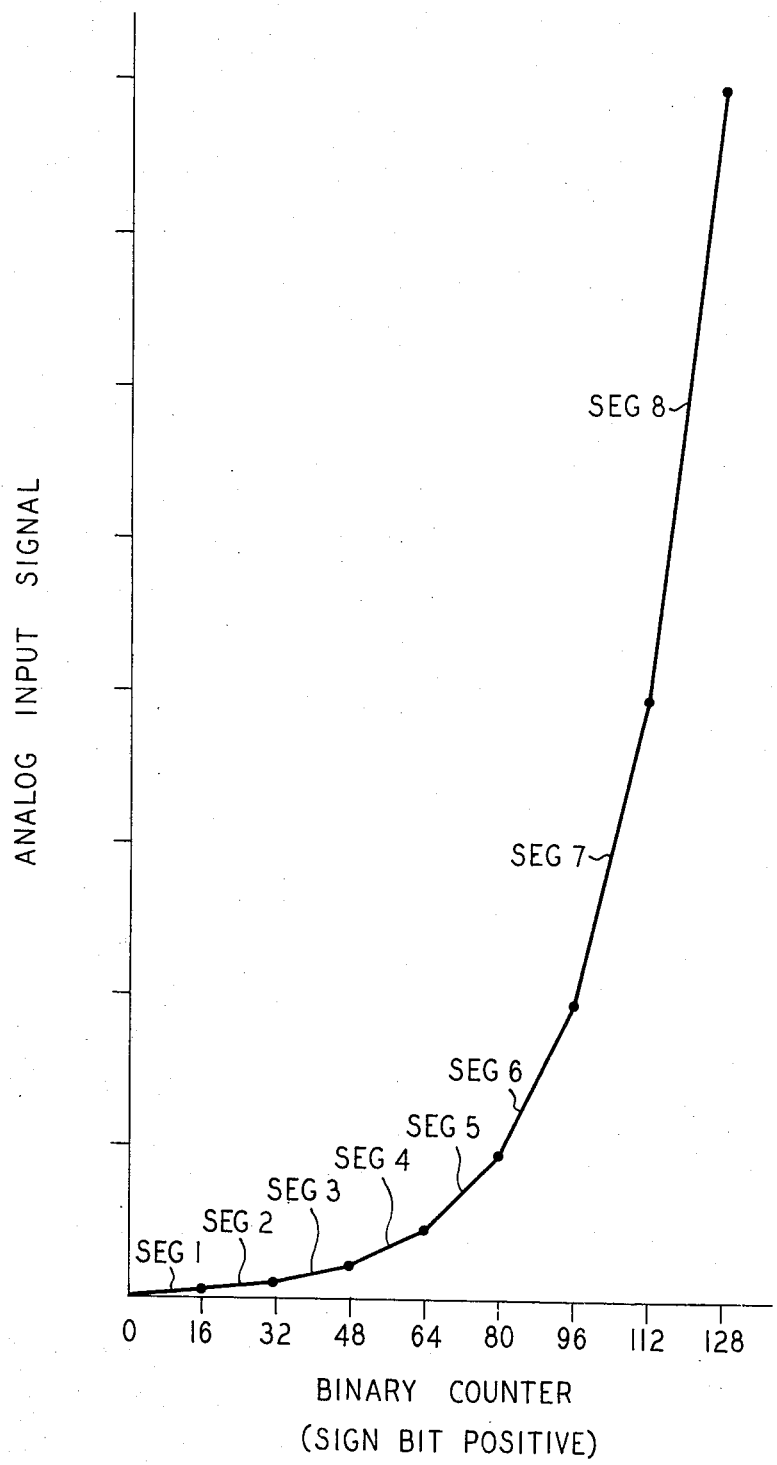
FIG. 2 graphically displays a 15-segment, $\mu = 255$ companding law, illustrating the positive quadrant relationship between an analog input signal and a binary counter output.

FIG. 2 graphically displays a positive quadrant of a known 15-segment, $\mu=255$ companding law. Ordinate "analog input signal" relates to the magnitude of an analog input signal applied to terminal 10 in FIG. 1. Abscissa "binary counter (sign bit positive)" relates to a PCM code word comprising information bits appearing at terminals 51-1 through 51-7 of counter 50 and a predetermined positive signal supplied to sign bit terminal 51-8 of sampler 70 in FIG. 1. The positive quadrant illustrates segments SEG1 through SEG8, each segment corresponding to 16 quantizing levels. The slope of a segment is related in a one-to-two ratio with the slope of an adjacent segment, i.e., in the ratio 1:2:4:8:16:32:64:128 for segments SEG1 through SEG8, respectively.

FIG. 3 shows a timing relationship among a plurality of signals within function generator 100. The signal ordinants are respectively labeled "$C_1(t)$", "$E_1(t)$", "$C_2(t)$", and "$E_2(t)$" and correspond to similarly indexed signals within function generator 100. The signals are shown, for ease of description, as responsive to a positive sign potential applied to sign terminal 120 in FIG. 1. Abscissa "timing signal clock pulses" relates to the number of clock pulses, and hence the number of timing signal intervals, which have elapsed since the reset signal, described hereinbefore, was applied to reset terminal 140. Signal $C_1(t)$ illustrates a binary logic enable signal applied to enable terminal 110. During a complete cycle of seven information bit, binary counter 50, i.e., counter 50 cycling from zero through 127, enable potential $C_1(t)$ comprises:

i. a logic "one" signal for respectively 1, 1, 2, 4, 8, 16, 32, and 64 clock pulse timing signal intervals, corresponding to segments SEG1 to SEG8, respectively; each group of pulse intervals being followed by
  ii. a logic "zero" signal for 16 clock pulse timing signal intervals, corresponding to the number of quantizing levels within a segment.

The remaining three signals illustrated in FIG. 3 represent as follows:

1. Slope signal $E_1(t)$ including one or more linear ramp signals, provided at an output of integrator 150,
2. Inhibit potential $C_2(t)$, which is the complement of enable signal $C_1(t)$ as extended through inverter 170 to inhibit terminal 190, and
3. Comparison signal $E_2(t)$ including one or more linear ramp signals, provided at an output of integrator 160 and extended to comparison signal terminal 180.

In FIG. 3, the illustrated piecewise linear segments of comparison signal $E_2(t)$, labeled SEG1 to SEG4, correspond to similarly labeled segments in FIG. 2.

Unfortunately, the comparison signal thus illustrated in FIG. 3 is not the desired comparison signal, as shown in FIG. 2. The illustrated comparison signal has "flat spots" FS1 through FS4 between counter clock pulses from 0 to 1, 17, to 18, 34 to 36, and 52 to 56, respectively. The flat spots arise during those intervals, described hereinafter, in which integrator 160 is not integrating. The adverse effect of the flat spots upon the PCM code word is advantageously eliminated, and the desired comparison signal obtained, by disabling binary counter 50 during the occurrence of a flat spot. Accordingly, binary counter 50 is disabled, responsive to a predetermined inhibit potential provided from terminal 190 over lead 230 to binary counter 50. Illustratively here, binary counter 50 is disabled responsive to a logic zero signal.

With the foregoing, the operation of illustrative function generator 100 can now be particularized. At the start of a coding interval, a reset signal is applied to reset terminal 140. Thereby normally open switches S3 and S4 are closed. Signals $E_1(t)$ and $E_2(t)$ are reset to the reference potential supplied to reference terminal 130. The reference potential corresponds to an initial condition on each of integrators 150 and 160. Here, the reference potential is taken to be the origin value zero in FIG. 3. Responsive to a logic one enable signal, applied to enable terminal 110 for one clock time interval, switch S1 closes and switch S2 opens. Since inhibit potential $C_2(t)$ is a logic zero, counter 50 is disabled. Thereafter, a positive sign potential, provided to sign terminal 120 from sign sampler 70, is connected through switch S1 to an input of integrator 150. The magnitude of the sign potential establishes the slope of a ramp output signal, shown in FIG. 3 as $E_1(t)$, between counter clock pulse 0 and pulse 1. After one clock pulse time interval, i.e., the time over which integrator 150 integrates, the logic signal applied to enable terminal 110 is inverted, thereby opening switch S1 and closing switch S2. Responsive thereto, binary counter 50 is enabled since the inhibit potential at terminal 190 is a logic one signal. The then output potential of integrator 150, i.e., the magnitude of slope signal $E_1(t)$ at counter clock pulse 1, is applied through switch S2 to an input of integrator 160. Responsive thereto integrator 160 provides to terminal 180 the SEG1 segment of function generator comparison signal $E_2(t)$. After 16 clock periods, i.e., the time over which integrator 160 integrates, the logic signal applied to enable terminal 110 is again inverted, thereby closing switch S1 and opening switch S2. The operation of function generator 100 continues through each of a plurality of segments until signal comparator 40 detects the aforementioned exceeding of the held signal.

Thereby, since deviations in the RC time constants of inexpensive integrators 150 and 160 only cause linear gain change, nonlinear distortion in the PCM code word is mitigated. Further, the need for precision components in function generator 100 is obviated and the timing accuracy of clock 60 substituted therefor.

Although the invention has been described and illustrated in detail as to a counting encoder, A/D converter, digital signal processing arrangement, it is to be understood that the same is by way of illustration and example only and is not to be taken by way of limitation. The spirit and scope of the invention are limited only by the terms of the appended claims.

I claim:

1. In combination in a digital signal processing arrangement for producing a comparison signal corresponding to a predetermined piecewise linear segment companding law:
   a first and a second integrator, each integrator having an input and an output terminal and operative for generating a ramp signal;
   a sign potential terminal;
   means for connecting said sign potential terminal to said input terminal of said first integrator;
   means for connecting said output terminal of said first integrator to said input terminal of said second integrator; and
   means for operating said first integrator substantially complemental to said second integrator to produce a piecewise linear segment signal.

2. The combination defined in claim 1 wherein said complemental operating means comprises:
   said first integrator being adapted to integrate responsive to a selected first timing signal, said first timing signal being selected from a plurality of integrating time intervals wherein a first time interval is related in a predetermined manner to a second time interval; and
   said second integrator being adapted to integrate responsive to a predetermined second timing signal, said second timing signal corresponding to a predetermined number of quantizing levels for a digitally encoded signal.

3. A digital processing arrangement including a first circuit for producing a comparison signal corresponding to a predetermined piecewise linear segment companding law, the arrangement characterized in that said first circuit comprises:
   a first and a second integrator, each integrator having an input and an output terminal and operative for generating a ramp signal;
   a first and a second switching means;
   a sign potential terminal connected to said input of said first integrator through said first switching means;
   means for connecting said output terminal of said first integrator to said input terminal of said second integrator through said second switching means; and
   means for operating said first switching means substantially complemental to said second switching means.

4. The arrangement defined in claim 3 wherein said complemental operating means comprises:
   said first switching means being adapted to close responsive to a first enable signal and to open responsive to a second enable signal.

5. The arrangement defined in claim 3 wherein said complemental operating means comprises:
   said second switching means being adapted to open responsive to a first enable signal and to close responsive to a second enable signal.

6. The arrangement defined in claim 4 further comprising:
   said second switching means being adapted to open responsive to said first enable signal and to close responsive to said second enable signal.

7. The arrangement defined in claim 6 wherein said first enable signal includes a signal selected from a plurality of integrating time intervals wherein a first time interval is related in a predetermined manner to a second time interval.

8. The arrangement defined in claim 7 wherein said predetermined related manner includes a first time interval being related to a second time interval in the ratio of the respective slopes of the corresponding linear segments of said predetermined piecewise linear segment companding law.

9. The arrangement defined in claim 6 wherein said second enable signal includes an integrating time signal corresponding to a predetermined number of quantizing levels for a PCM code word.

* * * * *